United States Patent
Huang

(10) Patent No.: US 6,614,656 B1
(45) Date of Patent: Sep. 2, 2003

(54) DISPLAY DEVICE WITH HIDDEN AIR VENTS

(75) Inventor: Gread Huang, Taoyuan Hsien (TW)

(73) Assignee: HannStar Display Corp., Tao-Yuan Hsien (TW)

( * ) Notice: Subject to any disclaimer, the term of this patent is extended or adjusted under 35 U.S.C. 154(b) by 0 days.

(21) Appl. No.: 10/266,765

(22) Filed: Oct. 9, 2002

(30) Foreign Application Priority Data

Jul. 5, 2002 (TW) ........................... 91210278 U

(51) Int. Cl.$^7$ ................................ H05K 7/20
(52) U.S. Cl. ................ 361/690; 361/681; 361/692; 174/16.1; 454/184; 220/366.1
(58) Field of Search ..................... 361/687, 678–683, 361/692; 174/16.1, 16.3, 35 R, 66, 67; 165/80.3, 104.33; 454/184; 220/366.1, 367.1

(56) References Cited

U.S. PATENT DOCUMENTS

| | | | | |
|---|---|---|---|---|
| 4,659,349 A | * | 4/1987 | Rodi et al. | 55/385.4 |
| 5,204,497 A | * | 4/1993 | Herrick | 174/35 R |
| 6,027,535 A | * | 2/2000 | Eberle et al. | 361/690 |
| 6,246,573 B1 | * | 6/2001 | Khan et al. | 361/683 |

* cited by examiner

Primary Examiner—Boris Chervinsky
(74) Attorney, Agent, or Firm—Troxell Law Office PLLC

(57) ABSTRACT

A display device with hidden air vents includes a main body and a casing. The main body includes a heat generating source. The casing is coupled with the main body and has a first wall and a second wall. The first wall corresponds to and is coupled tightly with the second wall. The first wall has a plurality of support ribs formed on the surface thereof. The second wall has a second edge with a flange formed thereon to connect the support ribs. The second edge of the second wall forms a gap of a selected width with the surface of the first wall.

7 Claims, 4 Drawing Sheets

DISPLAY DEVICE WITH HIDDEN AIR VENTS

FIELD OF THE INVENTION

The present invention relates to a display device and, more particularly, to a display device with hidden air vents.

BACKGROUND OF THE INVENTION

With rapid and developments of thin film transistor manufacturing technology, and the advantages of slim and light, and power saving and radiation-free, liquid crystal display (LCD) devices have been widely used in various electronic products, such as Personal Digital Assistants (PDAs), notebook computers, digital cameras, video cameras, mobile phones, and the like. In addition, continuous R & D funding has been invested in this field, and large scale production facilities have been adopted, quality of LCD devices improves continuously and prices are falling down constantly. All the above factors further expand its applications. Nowadays consumers demand bigger screens, smaller size, lighter weight, and longer operation time. However, the bigger screen consumes more power, and longer operating results in greater heat accumulation. Meanwhile the slim and light requirements on the physical condition tend to cause the electronic elements packed inside the device malfunction at the high temperature. Therefore, air vents are usually provided on the surface of the display devices to channel heated air to the ambience through convection to achieve heat dissipation effect.

Referring to FIG. 1, FIG 1 is for a conventional LCD device. The LCD device 10 includes a front panel 11 and a back panel 12. The front panel 11 has a liquid display area 13 for displaying image information. The back panel 12 has a plurality of air vents 14. In the interior of the LCD device 10, there are various types of electronic elements and IC circuits (not shown in the drawing). The front panel 11 has a first edge 15 to couple with a second edge 16 of the back panel 12 to form the product.

Referring to FIG. 2, the second edge 16 of the back panel 12 has a flange 17 to couple tightly with the bottom of the first edge 15 of the front panel 11. An ornamental groove 18 is formed between the first edge 15 and the second edge 16. As the front panel 11 and the back panel 12 are coupled tightly, heat generated inside the LCD device 10 is difficult to disperse. In order to overcome this problem, conventional LCD devices often have air vents 14 formed on the surface of the LCD device 10 to facilitate air convection to discharge heat. But the air vents 14 spoil the appearance of the LCD device 10 whether they are formed on the front panel 11 or the back panel 12. Moreover, as heat dissipation effect depends on the total area of the air vents 14, a great number of air vents 14 have to be made to increase the heat dissipation effect. This results in increased molding and manufacture costs. It also traps more external dusts and dirt into the LCD device 10 and impacts the useful life of the product.

Hence, to make the display with heat dissipation effect is one of the hot pursued issues among the LCD device producers.

SUMMARY OF THE INVENTION

The primary object of the invention is to provide a display device with hidden air vents. The heat dissipating air vents are located and hidden inside the ornamental groove to make the display device more appealing.

Another object of the invention is to provide a display device with hidden air vents to improve the heat dissipating efficiency.

Yet another object of the invention is to provide a display device with hidden air vents to simplify manufacturing processes and reduce fabrication costs.

A further object of the invention is to provide a display device with hidden air vents to prevent external dusts from directly entering into the device to increase useful life of the product.

According to this invention, the display device with hidden air vents includes a main body and a casing. The main body includes a heat generating source which consists of electronic elements contained in the main body. The casing is coupled with the main body and includes a first wall and a second wall. The first wall and the second wall correspond to each other and are coupled tightly. The first wall has a plurality of support ribs located on the surface thereof matching a flange formed on a second edge of the second wall. The flange is in contact with the support ribs. The second edge of the second wall and the surface of the first wall form a gap of a selected width therebetween.

In one embodiment of the invention, the gap has a first opening and a second opening. The first opening forms an ornamental groove while the second opening forms a hidden air vent.

In one embodiment, the main body is a LCD device located on the display area which may be on the first wall or the second wall for displaying image information.

The foregoing, as well as additional objects, features and advantages of the invention will be more readily apparent from the following detailed description, which proceeds with reference to the accompanying drawings.

DESCRIPTION OF THE PREFERRED EMBODIMENTS

According to the invention, the display device with hidden air vents has a casing consisting of a first wall and a second wall with matching edges coupled together to form a gap of a selected width. The gap has a first opening located at one end to form an ornamental groove and a second opening located at other end to form a hidden air vent to discharge heated air generated inside the display device through convection. More details of the invention are elaborated below by referring to the accompanying embodiments and drawings that use a LCD screen as an example.

Figure 1:
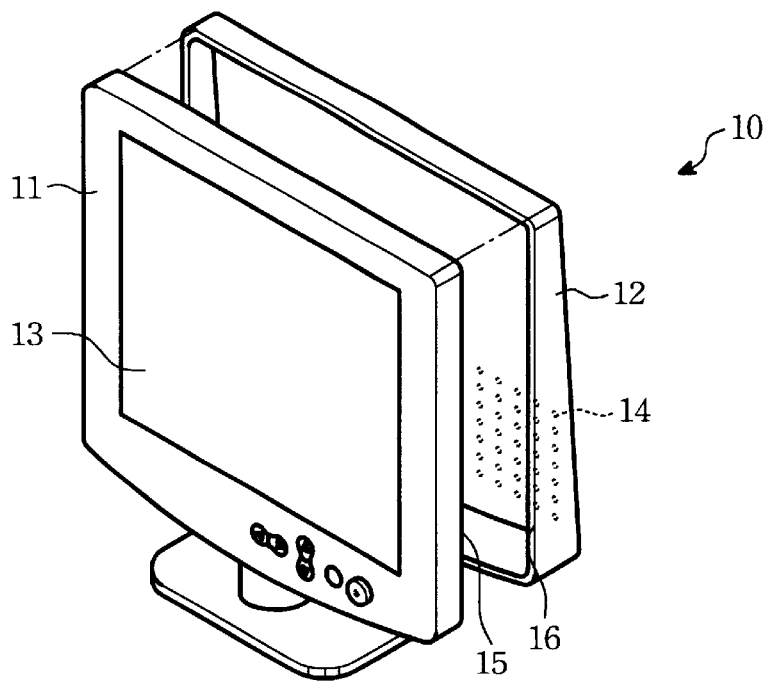
FIG. 1 is a schematic view of a conventional liquid crystal display (LCD) device.
Figure 2:
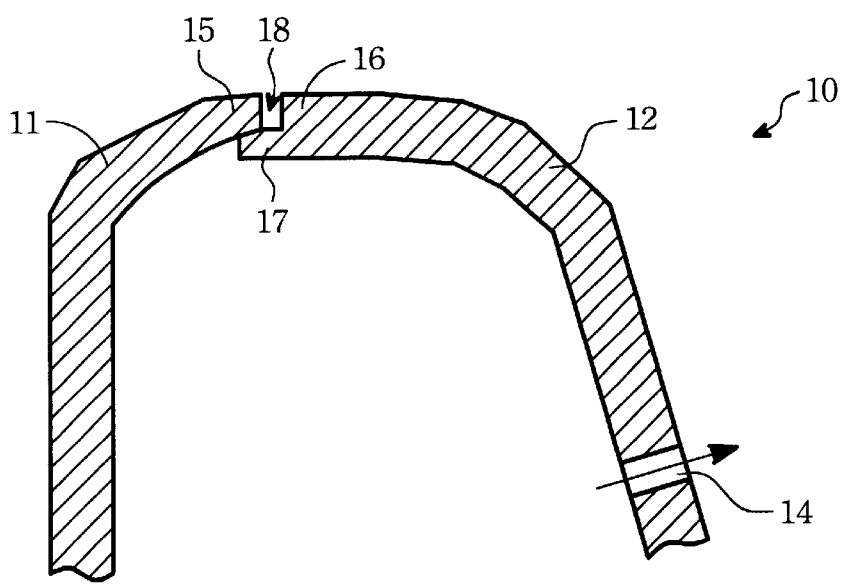
FIG. 2 is a cross section view of a front panel and a back panel of a conventional LCD device after assembled.
Figure 3A:
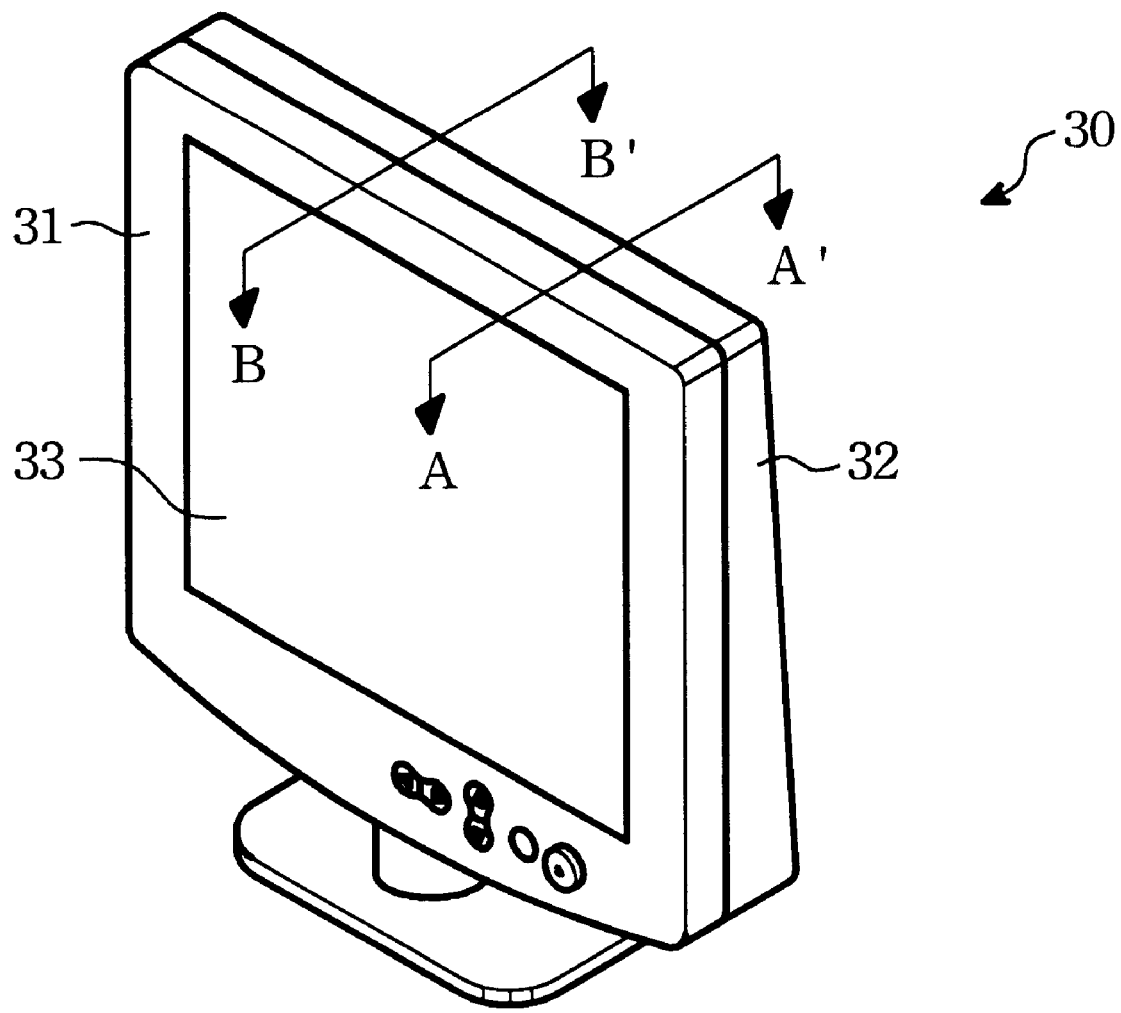
FIG. 3A is a schematic view of a first embodiment of the display device with hidden air vents of the invention.
Figure 3B:
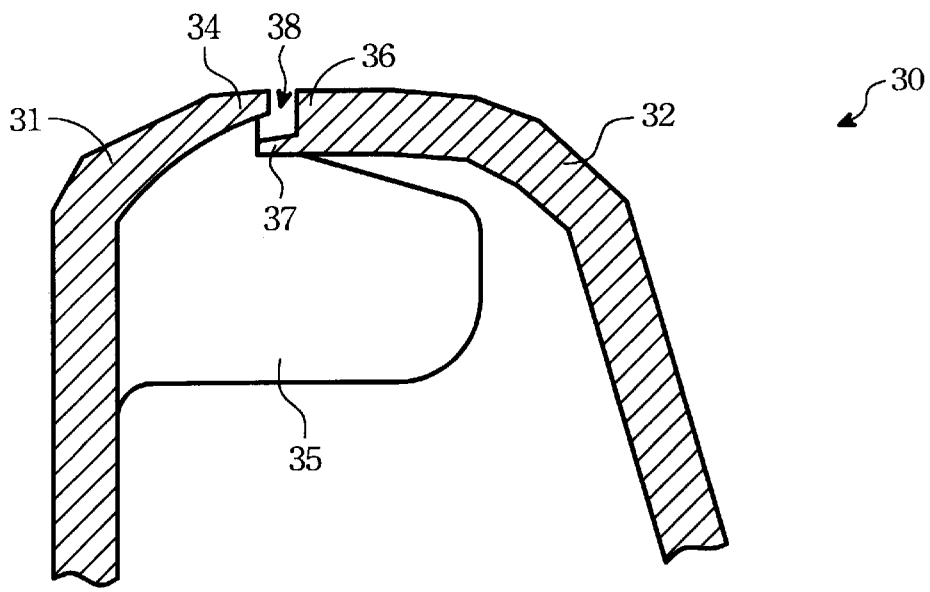
FIG. 3B is a cross section view of the first embodiment, showing the first wall coupled with the second wall including the support rib.
Figure 3C:
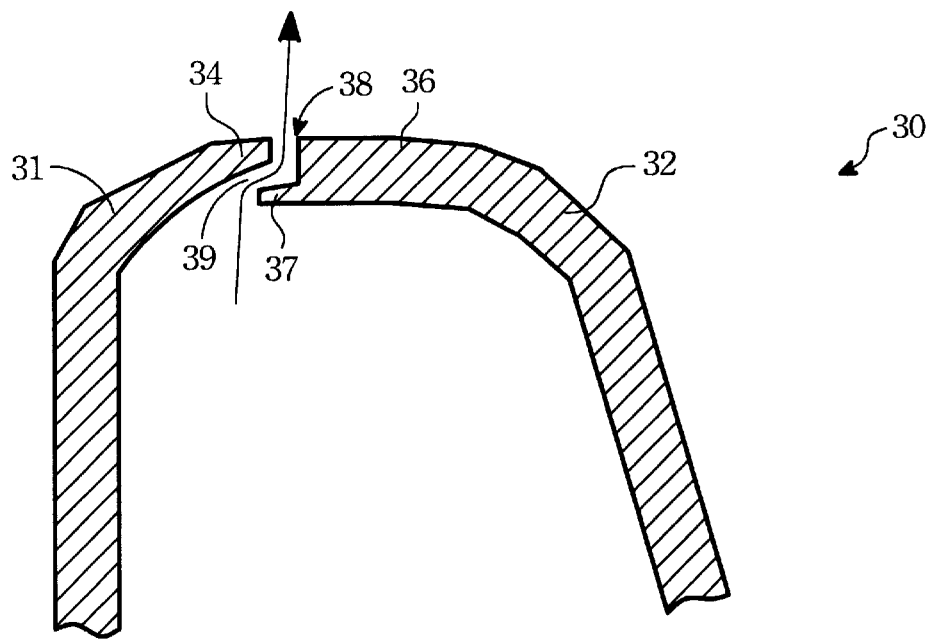
FIG. 3C is a cross section view of the first embodiment, showing the first wall coupled with the second wall including the hidden air vent.

Referring to FIGS. 3A, 3B and 3C for a first embodiment of the invention, the display device includes a main body and a casing 30. The main body has a heat generating source with the thermal energy generated by electronic elements contained in the main body during operations. The main body is housed in the casing 30, but it is not the main object of the invention, thus is not shown in the drawings.

The casing 30 includes a first wall 31 and a second wall 32. The first wall 31 and the second wall 32 correspond to each other and are coupled tightly. The first wall 31 has a liquid display area 33 for displaying image information and a first edge 34. On the inner side of the first wall 31, there are a plurality of support ribs 35 integrally formed with the first wall 31 from plastics. The second wall 32 has a second edge 36 with a flange 37 formed thereon. The casing 30 is coupled by resting the flange 37 of the second wall 32 on the support ribs 35 of the first wall 31 to form an intimate contact. The second edge 36 of the second wall 32 is spaced from the surface of the first wall 31 to form a gap with a selected width. The gap has a first opening 38 and a second opening 39. The first opening 38 forms an ornamental groove while the second opening 39 forms a hidden air vent. High temperature air generated by the main body in the casing 30 is channeled through the second opening 39 (hidden air vent) by convection for discharging out to achieve heat dissipating effect. FIG. 3B is a cross section view of the first embodiment, showing the first wall coupled with the second wall including the support rib. FIG. 3C is a cross section view of the first embodiment, showing the first wall coupled with the second wall including the hidden air vent.

As the heat dissipating air vents of the invention are hidden at the bottom section of the ornamental groove, there is no need to form additional heat dissipating air vents on the surface of the casing. Thus the surface of the display device of the invention has a completed and more attractive appearance than the conventional one. In addition to providing heat dissipating effect, the hidden air vents also can prevent external dusts from entering into the display device and therefore improve the useful life of the display device.

Figure 4A:
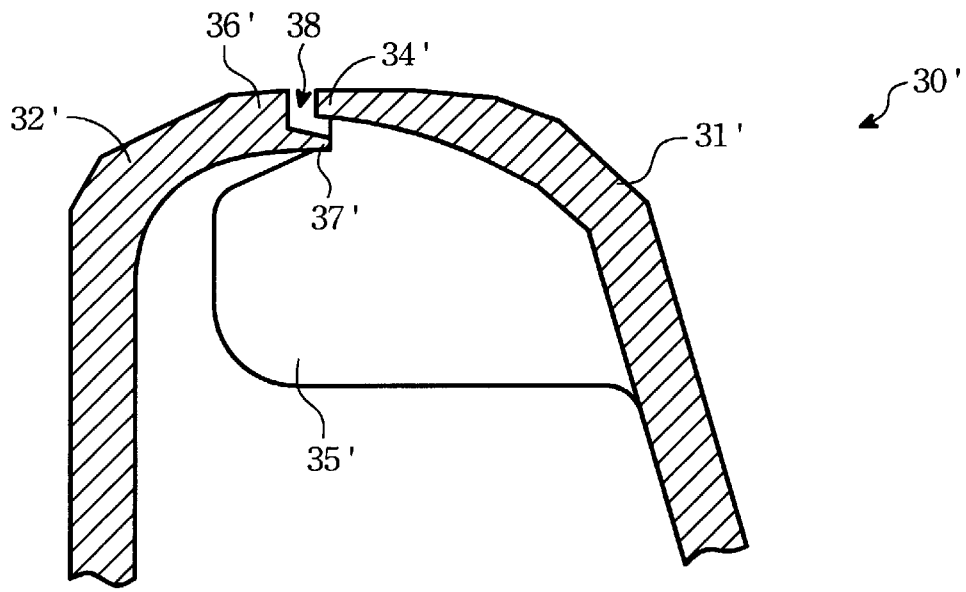
FIG. 4A is a cross section view of a second embodiment, showing the first wall coupled with the second wall including the support rib.
Figure 4B:
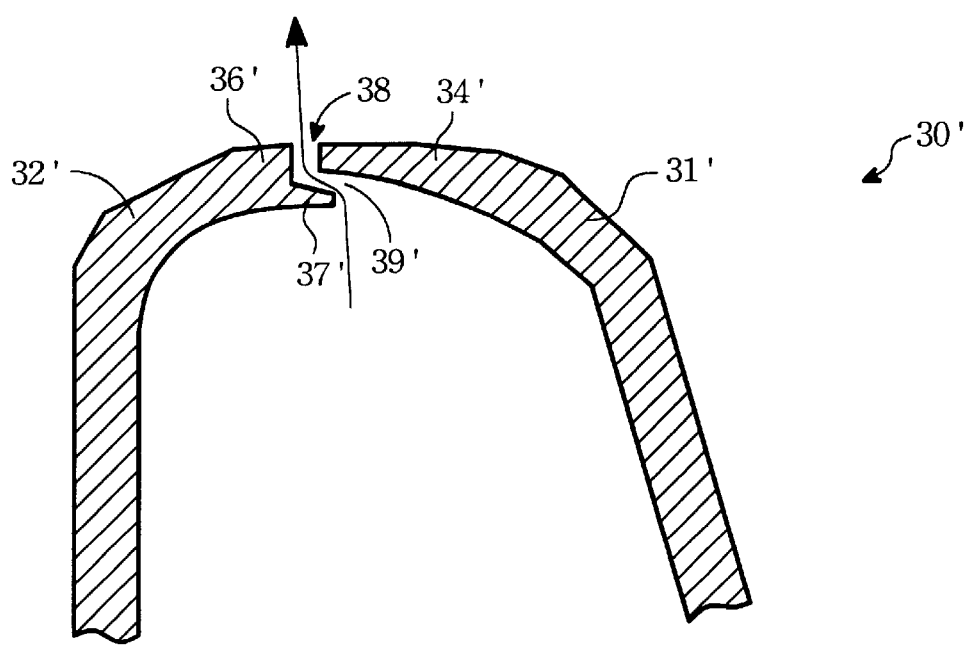
FIG. 4B is a cross section view of the second embodiment, showing the first wall coupled with the second wall including the hidden air vent.

Referring to FIGS. 4A and 4B for a second embodiment of the invention, it is largely constructed as the first embodiment set forth above. The hidden air vents also are located in the second opening 39' formed between the first wall 31' and the second wall 32'. However the relative positions of the first wall 31' and the second wall 32' are switched such that the first wall 31' is located behind the display device and the second wall 32' is located in front of the display device. And the liquid display area is located on the second wall 32'. The flange 37' is located on the inner side of the second edge 36' of the second wall 32' while a plurality of the support ribs 35' are formed on the inner side of the first edge 34' of the first wall 31'. The flange 37' is perched on the support ribs 35', and the second edge 36' of the second wall 32' is spaced from the surface of the first wall 31' to form a gap with a selected width. The gap has a first opening 38 to form an ornamental groove and a second opening 39' to form a hidden air vent. High temperature air generated by the main body in the casing 30' is channeled through the second opening 39' (hidden air vent) and the first opening 38 by convection for discharging out to achieve heat dissipating effect. All other features and functions are substantially same as the first embodiment, thus details are omitted.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A display device with hidden air vents, comprising:

a main body, including a heat generating source; and a casing, coupled with the main body, having a first wall and a second wall, the first wall being corresponded to and coupled tightly with the second wall;

wherein the first wall has a plurality of support ribs formed on the surface thereof, the second wall having a second edge with a flange formed thereon to connect the support ribs, the second edge forming a gap of a selected width with the surface of the first wall.

2. The display device with hidden air vents of claim 1, wherein the gap has a first opening for forming an ornamental groove and a second opening for forming a hidden air vent.

3. The display device with hidden air vents of claim 1, wherein the first wall and the support ribs are integrally formed.

4. The display device with hidden air vents of claim 1, wherein the first wall has a display area for displaying image information.

5. The display device with hidden air vents of claim 1, wherein the second wall has a display area for displaying image information.

6. The display device with hidden air vents of claim 1, wherein the main body is a liquid crystal display device.

7. The display device with hidden air vents of claim 1, wherein the first wall and the support ribs are made from plastics.

* * * * *